United States Patent
Chang et al.

[11] Patent Number: 6,004,836
[45] Date of Patent: Dec. 21, 1999

[54] METHOD FOR FABRICATING A FILM TRANSISTOR

[75] Inventors: Ting-Chang Chang, Hsinchu; Jing-Woei Chen, Taipei Hsien; Po-Sheng Shih, Hsinchu, all of Taiwan

[73] Assignee: United Microelectronics Corp., Taiwan

[21] Appl. No.: 09/238,110

[22] Filed: Jan. 27, 1999

[51] Int. Cl.⁶ .......................... H01L 21/336; H01L 21/84
[52] U.S. Cl. ...................... 438/151; 438/163; 438/164
[58] Field of Search .................................. 438/163, 164, 438/149, 151, 486, 487, FOR 155, FOR 184, FOR 201; 257/347

[56] References Cited

U.S. PATENT DOCUMENTS

| | | | |
|---|---|---|---|
| 4,399,605 | 8/1983 | Dash et al. | 438/163 |
| 5,581,102 | 12/1996 | Kusumoto | 257/347 |
| 5,693,549 | 12/1997 | Kim | 438/163 |

FOREIGN PATENT DOCUMENTS 3-165575   7/1991   Japan.

*Primary Examiner*—Mary Wilczewski
*Attorney, Agent, or Firm*—Blakely Sokoloff Taylor & Zafman

[57] ABSTRACT

A method to form a TFT includes providing an insulating substrate. An amorphous silicon layer, a first polysilicon layer, an oxide layer, a second polysilicon layer are sequentially formed on the insulating substrate and are patterned to form an active region. On the active region, there are a desired gate region, and a desired interchangeable source/drain region. A portion of the second polysilicon, the oxide layer, the first polysilicon layer above the desired interchangeable source/drain region are removed, and a top portion of the amorphous-Si layer with a depth is also removed. The remaining portion of the a-Si layer is converted into a conductive layer through, for example, laser crystallization method so as to serve as the interchangeable source/drain region.

10 Claims, 2 Drawing Sheets

METHOD FOR FABRICATING A FILM TRANSISTOR

BACKGROUND OF THE INVENTION

1. Field of the Invention

This invention relates to semiconductor fabrication, and more particularly to a method for fabricating a thin-film transistor (TFT).

2. Description of Related Art

Recently, a TFT has wide applications in a liquid crystal display (LCD) and other related products. The TFT typically includes two types: one is an amorphous TFT, and the other one is a polysilicon TFT. Generally, the amorphous-silicon TFT has lower leakage current but its field effect mobility is too low, causing its activating current to be low. The is the main problem of the amorphous-silicon TFT. The polysilicon TFT has higher field effect mobility with a larger activating current but its leakage current cannot be effectively reduced. The leakage current causes an increase of a switching current ($I_{on}/I_{off}$) The polysilicon TFT therefore cannot be applied in a large area LCD. It becomes an important issue for a TFT to increase the field effect mobility and reduce the switching current.

In the conventional technology, a lightly doped drain (LDD) structure can reduce leakage current but it needs a more complicate fabrication process. K. Y. Choi et al. And J. H. Jeon et al. proposed to use amorphous silicon (a-Si) as an offset structure in 1997 at SSDM. In this proposal, the leakage current can also be effectively reduced but its structure is still complicate.

SUMMARY OF THE INVENTION

It is at least an objective of the present invention to provide a method for fabricating a TFT with an a-Si offset layer. The method further includes a laser recrystallization method to form an interchangeable source/drain region. The improved method is simple and can effectively reduce leakage current. A TFT fabricated by the improved method has much wider applications and lower fabrication cost.

In accordance with the foregoing and other objectives of the present invention, an improved method for fabricating a TFT is provided. The improved method includes providing an insulating substrate. An amorphous silicon layer, a first polysilicon layer, an oxide layer, a second polysilicon layer are sequentially formed on the insulating substrate and are patterned to form an active region. On the active region, there are a desired gate region, and a desired interchangeable source/drain region. A portion of the second polysilicon, the oxide layer, the first polysilicon layer above the desired interchangeable source/drain region are removed, and a top portion of the A-Si layer with a certain depth is also removed. The remaining portion of the a-Si layer is converted into a conductive layer through, for example, re-crystallizing the a-Si layer so as to serve as the interchangeable source/drain region.

In the foregoing, a leakage current occurring at the region close to the drain region of the TFT is effectively reduced. The field effect mobility is increased, resulting an increases of the activating current. The switching current is effectively reduced since the leakage current is effectively reduced. The re-crystallization of the a-Si layer preferably done by a laser re-crystallization method so that the resistance of the interchangeable source/drain region is also reduced. The activating current therefore increases. A self-aligned property is also included in the improved method so that the fabrication process is effectively simplified.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

The invention provides a method with a laser re-crystallization method to fabricate a thin-film transistor (TFT). The TFT provided by the invention can be fabricated by an effectively simplified method and at least includes properties of high field effect mobility and low leakage current so that the activating current is high and the switching current is low.

Figure 1A:
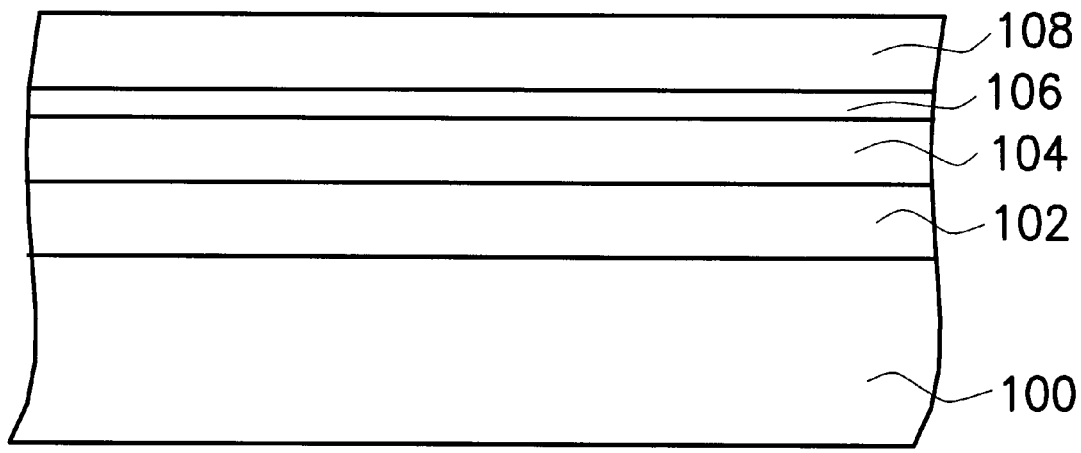
FIGS. 1A–1C are cross-sectional views of a portion of a substrate, schematically illustrating a fabrication process for forming a TFT, according to a preferred embodiment of the invention.
Figure 1B:
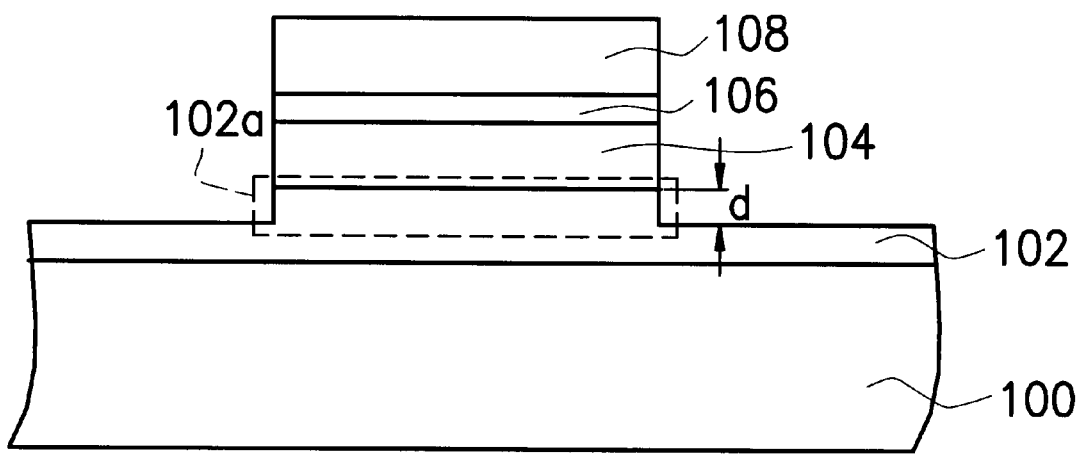
Figure 1C:
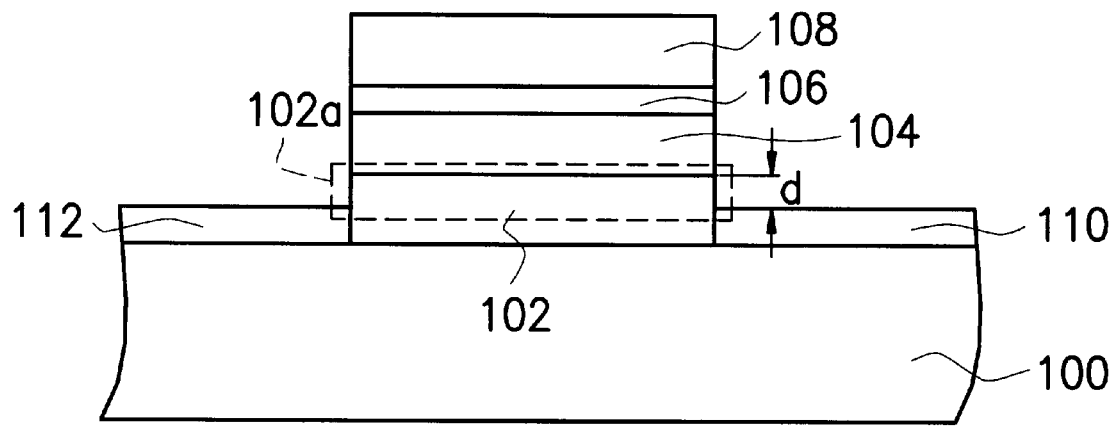

FIGS. 1A–1C are cross-sectional views of a portion of a substrate, schematically illustrating a fabrication process for forming a TFT, according to a preferred embodiment of the invention. In FIG. 1A, an insulating substrate 100 is provided. An amorphous silicon layer 102, a tunnel polysilicon layer 104, a gate oxide layer 106 and a gate polysilicon layer 108 are sequentially formed on the insulating substrate 100. The amorphous silicon layer 102 is formed by, for example, chemical vapor deposition (CVD) with a thickness of about 500–2500 angstroms. The tunnel polysilicon layer 104 is formed by, for example, CVD with a thickness of about 500–1000 angstroms. The gate oxide layer 106 is formed by, for example, CVD with a thickness of about 300–1000 angstroms. The gate polysilicon layer 108 is formed by, for example, CVD with a thickness of about 3000 angstroms. Since the tunnel polysilicon layer 104 does not take long to be formed, the amorphous silicon layer 102 is not re-crystallized yet. An active region shown in FIG. 1A is formed by patterning the four layers 102, 104, 106, and 108 through photolithography and etching. The active region typically includes a desire gate region and a desire interchangeable source/drain region (not shown).

In FIG. 1B, above the desired interchangeable source/drain region, portions of the gate polysilicon layer 108, the gate oxide layer 106, and the tunnel polysilicon layer 104 are removed so as to form a gate structure, in which the patterned gate polysilicon layer 108 serves as an actual gate of the TFT. A top portion of the amorphous silicon (a-Si) layer 102 on the desired interchangeable source/drain region is also removed with a depth of d, which is about 100–2000 angstroms. The portion of the a-Si layer 102 without being removed forms an offset layer 102a, distinguished by a dashed box in FIG. 1B. Photolithography and etching processes are typically used in the above patterning process.

Since the a-Si layer 102 has larger energy gap, carriers in a channel region between the tunnel polysilicon layer 104 and the a-Si layer 102 have a tendency to be driven to the tunnel polysilicon layer 104 that has a lower energy gap. An activating current, an field effect mobility, and other physical properties are improved. Moreover, since the a-Si layer can effectively reduce an electric field in the depletion region, a leakage current is also effectively reduced.

In FIG. 1C, the portion of the a-Si layer 102, other than the offset layer 102a, on the desired interchangeable source/ drain region is exposed and is necessary to be transformed into a conductive region and crystallized to serve as an actual interchangeable source/drain region. The exposed portions of the amorphous silicon layer 102 are crystallized preferably by a laser crystallization method. Using the gate polysilicon layer 108 as a mask, a laser, such as an excimer laser, with an energy of about 100–300 micro-joules/cm$^2$ is used to crystallize the a-Si layer 102. A laser pulse rate is about 50–200 times/min. A source region 112 and a drain region 110 are formed abutting the offset layer 102a, which remains amorphous. Since a gate structure including the patterned gate polysilicon layer 108, the gate oxide layer 106, and the tunnel polysilicon layer 104 serves as a natural mask without alignment, there is no additional mask. This is a self-aligned property. The fabrication process is effectively simplified. Moreover, the laser can form larger crystal grains in the source region 112 and the drain region 110, their resistance is effectively reduced, and the activating current is increased.

Figure 2:
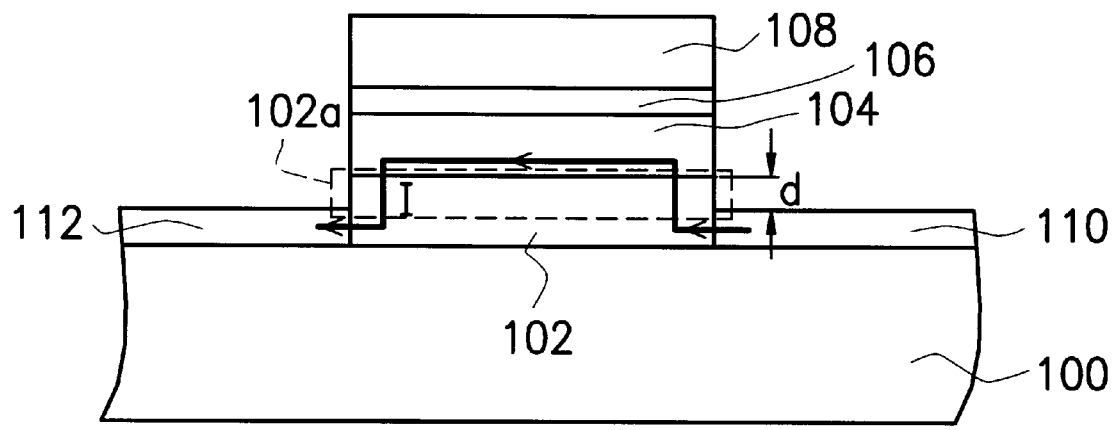
FIG. 2 is a cross-sectional view of a TFT, schematically illustrating a current flow direction of the activating current, according to the preferred embodiment of the invention.

FIG. 2 is a cross-sectional view of a TFT, schematically illustrating a current flow direction of the activating current, according to the preferred embodiment of the invention. As the gate polysilicon layer 108, the source region 112, and the drain region 110 are properly applied with biases, a current I flows from the drain region 110 to the drain region 112 following a thick line with arrow that shows the current behaviors. The current I crosses the offset layer 102a, flows through the tunnel polysilicon layer 104, crosses the offset layer 102a again, and enter the drain region 112. The distance d and the energy gap are adjustable to satisfy a desired property, in which the energy gap can be indirectly adjusted while the laser recryatallization method is performed. As the laser is applied to recrystallize the a-Si layer 102, an interface between the offset layer 102a and the desired drain region 110 can be controlled to have a proper degree of recrystallization. Similarly, a proper degree of recrystallization at an interface between the offset layer 102a and the desired drain region 112 is adjusted. So, the energy gap is adjusted.

In conclusion, the method provided by the invention to form a TFT includes several characteristics as follows:

1. Since the a-Si layer 102 has larger energy gap, carriers in the channel region between the tunnel polysilicon layer 104 and the a-Si layer 102 have a tendency to be driven to the tunnel polysilicon layer 104 that has a lower energy gap. An activating current, an field effect mobility, and other physical properties are improved.
2. The leakage current at the drain region is effectively reduced.
3. A laser recrystallization method is used to produce larger crystal grains so that the resistance of the source/drain regions are effectively reduced.
4. A self-aligned property is included in the method so that the fabrication process is effectively simplified.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a thin-film transistor (TFT), the method comprising:

providing an insulating substrate;

sequentially forming an amorphous silicon layer, a first polysilicon layer, an oxide layer and a second polysilicon layer on the insulating substrate;

patterning the second polysilicon layer, the oxide layer, the first polysilicon layer, and the amorphous silicon layer to form an active region, which comprises a desired gate region and a desired interchangeable source/drain region;

sequentially removing the second polysilicon layer, the oxide layer, the first polysilicon layer to form a gate structure and then removing a top portion of the amorphous silicon layer extending beyond the gate structure at a portion within the desired interchangeable source/drain region to form exposed portions of the amorphous silicon layer which have a thickness less than that of the amorphous silicon layer; and crystallizing the exposed portions of the amorphous silicon layer and making side exposed portions of the amorphous silicon layer conductive.

2. The method of claim 1, wherein the amorphous silicon layer comprises a thickness of about 500–2500 angstroms.

3. The method of claim 1, wherein the first polysilicon layer comprises a thickness of about 500–1000 angstroms.

4. The method of claim 1, wherein the oxide layer comprises a thickness of about 300–1000 angstroms.

5. The method of claim 1, wherein the second polysilicon layer comprises a thickness of about 3000 angstroms.

6. The method of claim 1, wherein in the step of sequentially removing the second polysilicon layer, the oxide layer, the first polysilicon layer, and a portion of the amorphous silicon layer, the top portion of the amorphous silicon layer comprises a depth of about 100–2000 angstroms.

7. The method of claim 1, wherein formation of the amorphous silicon layer, the first polysilicon layer, the oxide layer and the second polysilicon layer comprises chemical vapor deposition (CVD).

8. The method of claim 1, wherein the exposed portions of the amorphous silicon layer are crystallized by a laser crystallization method, using the patterned second polysilicon layer as a mask.

9. The method of claim 8, wherein the laser recrystallization method comprises a laser beam with an beam energy of about 100–300 micro-joule/cm$^2$.

10. The method of claim 8, wherein the laser recrystallization method comprises a laser beam with a pulse rate of about 50–200 times/minute.

* * * * *

UNITED STATES PATENT AND TRADEMARK OFFICE
CERTIFICATE OF CORRECTION

PATENT NO. : 6,004,836
DATED : December 21, 1999
INVENTOR(S) : Chang et al.

It is certified that error appears in the above-identified patent and that said Letters Patent is hereby corrected as shown below:

In column 1, line 19, delete "current ($I_{on}/I_{off}$) The" and insert -- current ($I_{on}/I_{off}$). The --.

Signed and Sealed this

Third Day of April, 2001

*Attest:*

NICHOLAS P. GODICI

*Attesting Officer*     *Acting Director of the United States Patent and Trademark Office*